(12) United States Patent
Hu et al.

(10) Patent No.: US 8,809,107 B2
(45) Date of Patent: Aug. 19, 2014

(54) METHOD FOR MAKING SCHOTTKY BARRIER DIODE

(75) Inventors: Chun-Hua Hu, Beijing (CN);
Chang-Hong Liu, Beijing (CN);
Shou-Shan Fan, Beijing (CN)

(73) Assignees: Tsinghua University, Beijing (CN);
Hon Hai Precision Industry Co., Ltd.,
New Taipei (TW)

( * ) Notice: Subject to any disclaimer, the term of this patent is extended or adjusted under 35 U.S.C. 154(b) by 255 days.

(21) Appl. No.: 13/337,235

(22) Filed: Dec. 26, 2011

(65) Prior Publication Data

US 2013/0029459 A1    Jan. 31, 2013

Related U.S. Application Data

(63) Continuation of application No. 13/324,769, filed on Dec. 13, 2011, now abandoned.

(30) Foreign Application Priority Data

Jul. 29, 2011    (CN) .......................... 2011 1 0215767

(51) Int. Cl.
*H01L 21/04*    (2006.01)
*H01L 51/05*    (2006.01)
*H01L 51/00*    (2006.01)

(52) U.S. Cl.
CPC ......... *H01L 51/0579* (2013.01); *H01L 51/0048* (2013.01); *Y10S 977/742* (2013.01)
USPC 438/92; 438/597; 257/E29.338; 257/E21.359; 977/742

(58) Field of Classification Search
USPC ............ 438/92, 584, 597, 570, 571; 977/742, 977/773, 720; 257/E21.359, E29.338
See application file for complete search history.

(56) References Cited

U.S. PATENT DOCUMENTS

| 7,494,907 | B2 * | 2/2009 | Brown et al. ................. 438/584 |
| 2004/0256612 | A1 * | 12/2004 | Mohseni et al. ................ 257/14 |
| 2006/0261433 | A1 * | 11/2006 | Manohara et al. ............ 257/471 |
| 2010/0003528 | A1 | 1/2010 | Rozhin et al. |
| 2010/0193376 | A1 | 8/2010 | Rius Ferrus et al. |
| 2010/0252802 | A1 | 10/2010 | Numata et al. |
| 2011/0204317 | A1 * | 8/2011 | Park et al. ........................ 257/9 |
| 2011/0220191 | A1 * | 9/2011 | Flood ............................ 136/255 |
| 2011/0224357 | A1 | 9/2011 | Ziser et al. |

FOREIGN PATENT DOCUMENTS

| JP | 2007-182363 | 7/2007 |
| JP | 2008-37742 | 2/2008 |
| JP | 2008-53607 | 3/2008 |
| JP | 2010-531434 | 9/2010 |
| JP | 2011-521063 | 7/2011 |
| TW | 201009308 | 3/2010 |
| WO | WO2009031336 | 3/2009 |

* cited by examiner

*Primary Examiner* — Savitr Mulpuri
(74) *Attorney, Agent, or Firm* — Novak Druce Connolly Bove + Quigg LLP

(57) ABSTRACT

A method for making a Schottky barrier diode includes the following steps. A first metal layer, a second metal layer and a carbon nanotube composite material are provided. The carbon nanotube composite material is applied on the first metal layer and the second metal layer to form a semiconductor layer. The carbon nanotube composite material includes an insulated polymer and a number of carbon nanotubes dispersed in the insulated polymer. The semiconductor layer is in Schottky contact with the first metal layer and in ohmic contact with the second metal layer.

16 Claims, 6 Drawing Sheets

Providing the first metal layer 12, the second metal layer 16 and a carbon nanotube composite material, wherein the carbon nanotube composite material includes the insulated polymer 144 and the carbon nanotubes 142 dispersed in the insulated polymer 144 — S10

Applying the carbon nanotube composite material on the first metal layer 12 and the second metal layer 16 to form the semiconductor layer 14, thereby forming the SBD 10 — S20

FIG. 4

METHOD FOR MAKING SCHOTTKY BARRIER DIODE

RELATED APPLICATIONS

This application is a continual application of U.S. Patent Application, entitled "SCHOTTKY BARRIER DIODE" with application Ser. No.13/324,769, filed on Dec. 13, 2011.

BACKGROUND

1. Technical Field

The present disclosure relates to a method for making a Schottky barrier diode.

2. Discussion of Related Art

A Schottky barrier diode (SBD) has low power, high current and super high speed; therefore, it can be applied in various of electronic devices. The SBD generally includes a noble metal and a semiconductor layer contacted with the noble metal. A barrier having a rectifying property is formed in an interface between the noble metal and the semiconductor layer. The conventional semiconductor layer is made of rigid inorganic material, therefore, it is not suitable for flexible electronic devices.

An organic material of copper phthalocyanine can be used in an SBD as a semiconductor layer, and the SBD using copper phthalocyanine can be applied in flexible electronic devices. However, the semiconductor layer made of copper phthalocyanine has a low electronic mobility, such as $1.74 \times 10^{-9}$ square centimeter per voltage·second ($cm^2/(V \cdot s)$), and it is not easy to obtain copper phthalocyanine. In addition, the flexibility of the SBD needs to be improved.

What is needed, therefore, is to provide an SBD, which can overcome the shortages discussed above.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

FIG. 4 shows a making process flowchart of the SBD shown in FIG. 1.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
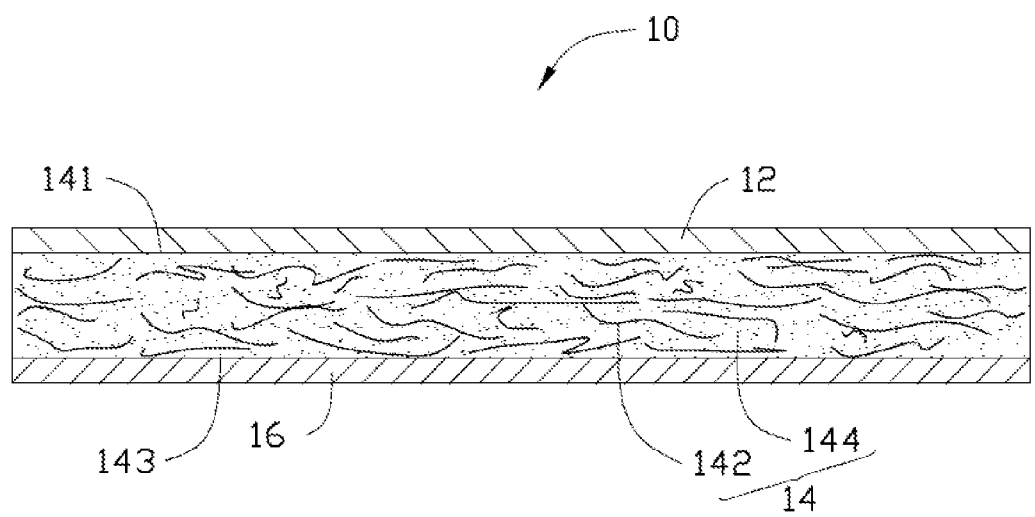
FIG. 1 is a cut-away view of one embodiment of an SBD, wherein the SBD includes a semiconductor layer.

Referring to FIG. 1, one embodiment of an SBD 10 is provided. The SBD 10 includes a first metal layer 12, a semiconductor layer 14, and a second metal layer 16. The first metal layer 12 and the second metal layer 16 are spaced from each other and electrically connected with the semiconductor layer 14. The first metal layer 12 is in Schottky contact with the semiconductor layer 14, and a Schottky barrier is formed at a first interface 141 between the first metal layer 12 and the semiconductor layer 14. The second metal layer 16 is in ohmic contact with the semiconductor layer 14, and a small barrier or even no contact barrier is formed at a second interface 143 between the semiconductor layer 14 and the second metal layer 16. The semiconductor layer 14 is a flexible polymer composite layer. The semiconductor layer includes an insulated polymer material 144 and a number of carbon nanotubes 142 dispersed in the insulated polymer material 144. In one embodiment, the first metal layer 12, the semiconductor layer 14 and the second metal layer 16 are, in sequence, stacked with each other such that the semiconductor layer 14 is located between the first metal layer 12 and the second metal layer 16.

The semiconductor layer 14 is a thin film structure. A shape of the semiconductor layer 14 is not limited, and it can be circle, rectangle, square, or pentagon. The semiconductor layer 14 has good semiconductivity and flexibility. The semiconductor layer 14 has enough band gaps to satisfy the demand of an electronic material. A weight percentage of the carbon nanotubes 142 in the semiconductor layer 14 can be in a range from about 0.1% to about 1%. In one embodiment, the weight percentage of the carbon nanotubes 142 can be in a range from about 0.2% to about 0.5% in the semiconductor layer 14. In one embodiment, the carbon nanotubes 142 can be uniformly dispersed in the insulated polymer material 144 and cannot form a net structure. In one embodiment, the carbon nanotubes 142 can form a net structure in the insulated polymer material 144.

The insulated polymer material 144 can be silicon gel, silicone rubber, hypoxia resin, epoxy resin, acrylic resin, or polyester. The carbon nanotubes 142 can be single-walled carbon nanotubes, double-walled carbon nanotubes, multi-walled carbon nanotubes, or combination thereof. A diameter of the single-walled carbon nanotubes is in the approximate range from 0.5 nanometers (nm) to 50 nm. A diameter of the double-walled carbon nanotubes is in the approximate range from 1.0 nm to 50 nm. In one embodiment, the carbon nanotubes 142 are semiconductor carbon nanotubes. A thickness of the semiconductor layer 14 can be in a range from about 1 μm to about 1 mm. In one embodiment, the thickness of the semiconductor layer 14 is about 150 μm. A current carrier mobility of the semiconductor layer 14 can be in a range from about 0.1 $cm^2/(V \cdot s)$ to about 10 $cm^2/(V \cdot s)$.

The semiconductor layer 14 can be a P-type semiconductor or N-type semiconductor. When the semiconductor layer 14 is the P-type semiconductor, a first metal layer work function 12 is less than a semiconductor layer work function, and a second metal layer work function is equal to or more than the semiconductor layer work function. In one embodiment, the carbon nanotubes 142 in the semiconductor layer 14 are pure carbon nanotubes, which can absorb oxygen gas to display P-type characteristics, such that the semiconductor layer 14 is the P-type semiconductor.

When the semiconductor layer 14 is the N-type semiconductor, the first metal layer work function is more than the semiconductor layer work function of, and the second metal layer work function is equal to or less than the semiconductor layer work function. In one embodiment, the carbon nanotubes 142 dispersed in the insulated polymer material 144 are chemically doped to display N-type characteristics, such that the semiconductor layer 14 is the N-type semiconductor. In one embodiment, the N-type semiconductor layer 14 is formed by soaking the carbon nanotubes 142 with a polyethyleneimine solution firstly, and then dispersing the soaked carbon nanotubes 142 in the insulated polymer material 144.

Figure 2:
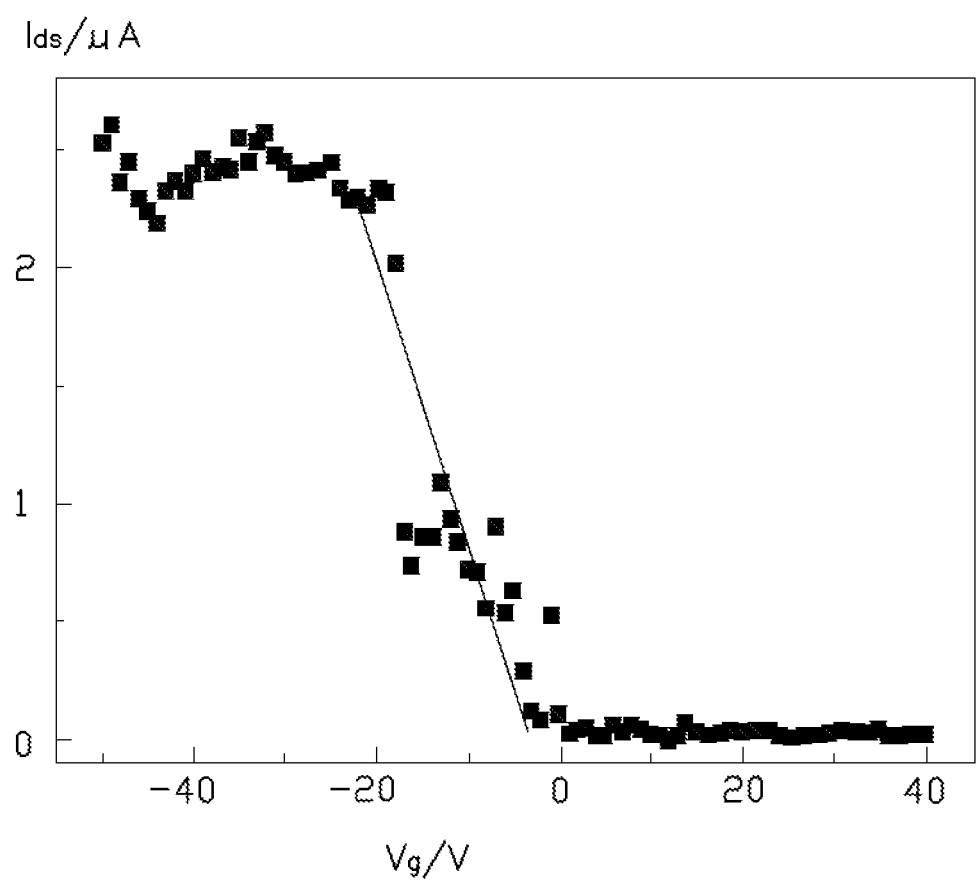
FIG. 2 shows a current $I_{ds}$ between a source electrode and a drain electrode—gate voltage $V_g$ curve of a thin film transistor, wherein the thin film transistor uses the semiconductor layer shown in FIG. 1.

In one embodiment, the insulated polymer material 144 in the semiconductor layer 14 is polydimethylsiloxane (PDMS). The weight percentage of the carbon nanotubes 142 is about 0.35%, and the carbon nanotubes 142 are joined with each other to form a net structure in the semiconductor layer 14. Thus, the band gaps can reach to 0.36 equivalent volt (eV), the semiconductor layer work function is ranged from about 4.6 eV to about 4.9 eV, the current carrier mobility of the semiconductor layer 14 is about 1.98 $cm^2/(V \cdot s)$ calculated from FIG. 2 and a current carrier mobility formula.

The first metal layer 12 and the second metal layer 16 can be located on surfaces of the semiconductor layer 14 or inserted into the semiconductor layer 14. Both the first metal layer 12 and the second metal layer 16 are thin sheet structures. Thicknesses of the first metal layer 12 and the second metal layer 16 can range from about 10 nanometers to about 100 micrometers. The thickness of the first metal layer 12 and the second metal layer 16 can be same or different. It is noted that the thicknesses of the first metal layer 12 and the second metal layer 16 are not limited to above-mentioned. Shapes of the first metal layer 12 and the second metal layer 16 are not limited to circle, rectangle, square, or pentagon.

Materials of the first metal layer 12 and the second metal layer 16 are not limited, as long as one of the first and second metal layers 12, 16 is in electrically Schottky contact with the semiconductor layer 14, and the other one is in ohmic contact with the semiconductor layer 14. In one embodiment, the first metal layer 12 is in Schottky contact with the semiconductor layer 14, the second metal layer 16 is in ohmic contact with the semiconductor layer 14. The material of the first metal layer 12 can be copper, aluminum, silver or other noble metals. The material of the second metal layer 16 can be gold, palladium, platinum or other noble metals. In one embodiment, the first metal layer 12 is a round copper sheet with the thickness of about 50 nm; and the second metal layer 16 is a round gold sheet with the thickness of about 50 nm.

Figure 3:
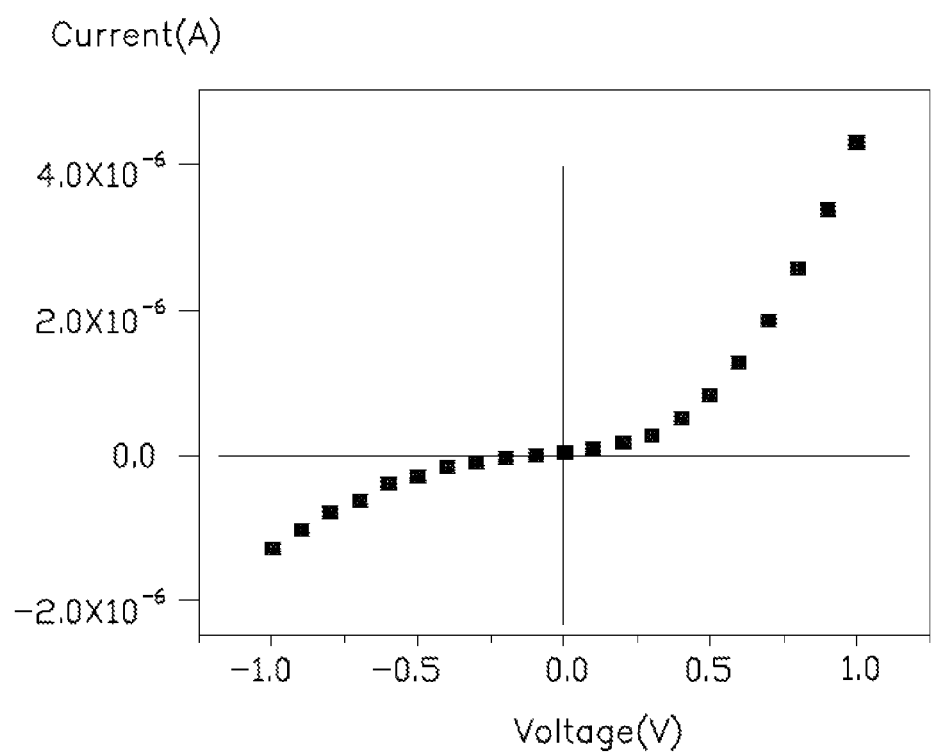
FIG. 3 shows a current—voltage curve of the SBD shown in FIG. 1.

The semiconductor layer 14 is consisted of the insulated polymer material 144 and the carbon nanotubes 142, both the carbon nanotubes 142 and the insulated polymer material 144 are flexible, which makes the semiconductor layer 14 flexible. Both the first and second metal layers 12, 16 are also flexible and can be bended. Therefore, the SBD 10 can also be flexible, and be widely used in flexible electronic devices. In addition, the SBD 10 has a good rectifying property according to FIG. 3.

Referring to FIG. 4, one embodiment of a method for making the SBD 10 is provided. The method includes the following steps.

S10, providing the first metal layer 12, the second metal layer 16 and a carbon nanotube composite material, wherein the carbon nanotube composite material includes the insulated polymer 144 and the carbon nanotubes 142 dispersed in the insulated polymer 144; and S20, applying the carbon nanotube composite material on the first metal layer 12 and the second metal layer 16 to form the semiconductor layer 14, thereby forming the SBD 10.

In step S10, the carbon nanotube composite material is used to form the semiconductor layer 14. The carbon nanotube composite material can be made by the following steps of: dissolving a monomer into an organic solution to form a polymer solution; dispersing the carbon nanotubes 142 into the polymer solution to obtain a first mixture; evaporating the organic solution in the first mixture to get a second mixture; and adding a cross-linking agent into the second mixture to form the carbon nanotube composite material.

The monomer is a material that can be polymerized into the insulated polymer material 144. Therefore, the monomer can be dimethyl siloxane (DMS) or methyl vinyl siloxane. The organic solvent is used to dissolve the monomer, such as ethyl acetate, or ethyl ether.

In one embodiment, the method for making the carbon nanotube composite material includes the steps of: firstly, adding DMS into ethyl acetate and stirring to form a pellucid DMS solution; next, adding the carbon nanotubes 142 into the pellucid DMS solution and ultrasonically dispersing for about 20 minutes to form a third mixture, wherein a weight percentage of the carbon nanotubes 142 in the third mixture is about 0.35%; evaporating ethyl acetate in the third mixture to obtain a fourth mixture; then, adding tetraethoxysilane into the fourth mixture, wherein, a weight ratio of tetraethoxysilane to DMS is about 6:100.

The step S20 can include the sub-steps of:

S21, providing the first metal layer 12 with a sheet shape structure, and applying the carbon nanotube composite material on the first metal layer 12; and S22, providing the second metal layer 16 with a sheet shape structure, and locating the second metal layer 16 on a surface of the carbon nanotube composite material opposite to the first metal layer 12.

If the carbon nanotube composite material is in a liquid state, the step S21 can include sub-steps of: dropping the carbon nanotube composite material on a surface of the first metal layer 12; and then putting the first metal layer 12 with the carbon nanotube composite material thereon into a vacuum environment, to deaerate from the carbon nanotube composite material, until air bubbles are completely removed. A temperature of the vacuum environment is about 25 centigrade degree. A deaerating time can be in a range from 1 minute to about 20 minutes. In one embodiment, the deaerating time is about 5 minutes.

If the carbon nanotube composite material is pretreated into a determined shape, the step S21 can be executed by adhering the carbon nanotube composite material to the surface of the first metal layer 12 by an adhesive to form the semiconductor layer 14. In one embodiment, the adhesive can be phenol-formaldehyde resin adhesive, polyurethane adhesive, or epoxy resin adhesive.

The step S22 can include curing the carbon nanotube composite on the first metal layer 12 to be in a quasi-solid state; then applying the second metal layer 16 on the quasi-solid carbon nanotube composite material; and further curing the carbon nanotube composite until the carbon nanotube composite is completely cured, thereby forming the semiconductor layer 14. The quasi-solid carbon nanotube composite material is adhesive, therefore the second metal layer 16 can be adhered to the semiconductor layer 14 directly.

The method for making the SBD 10 can further include a step S30 of packaging the SBD 10. The step S30 includes forming a liquid resin to wrap the SBD 10; and then curing the liquid resin to package the SBD 10. In one embodiment, the step of forming the liquid resin on the SBD 10 can be executed by using a brush to coat the liquid resin on surfaces of the SBD 10 to wrap the SBD 10. In another embodiment, the step S30 can immerse the SBD 10 into the liquid resin to wrap the SBD 10. In one embodiment, the step S30 can be executed by putting the SBD 10 into a mold and then injecting the liquid resin into the module. The liquid resin is formed by dissolving a polymer into an organic solvent.

Figure 5:
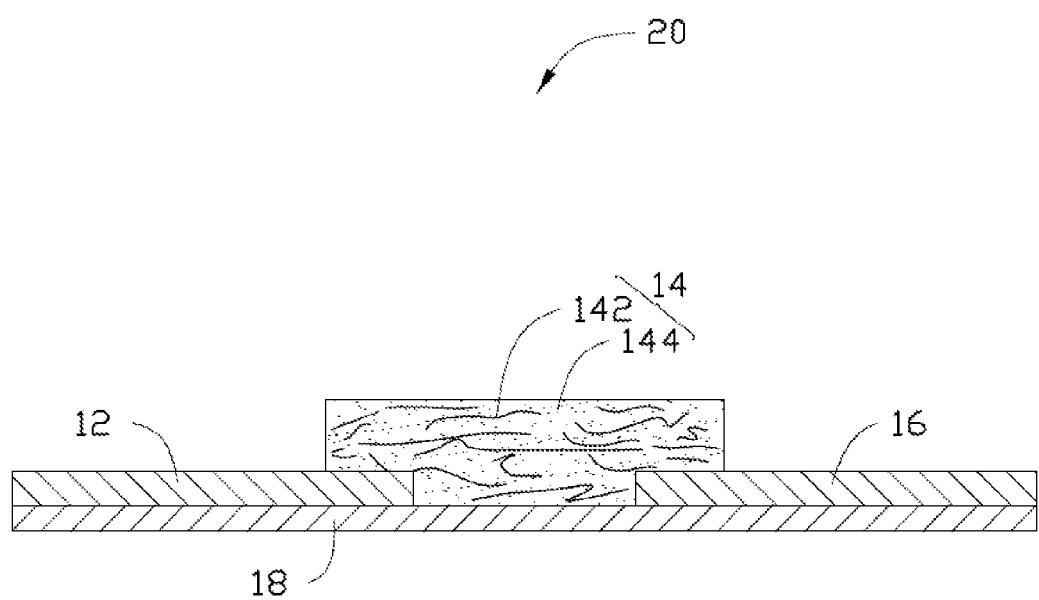
FIG. 5 is a cut-away view of one embodiment of an SBD.

Referring to FIG. 5, one embodiment of an SBD 20 is provided. The SBD 20 includes an insulated substrate 18, the first metal layer 12, the semiconductor layer 14 and the second metal layer 16. The first metal layer 12 and the second metal layer 16 are separately located on a surface of the insulated substrate 18, the semiconductor layer 14 is located on the surface of the insulated substrate 18 between the first metal layer 12 and the second metal layer 16, and the semiconductor layer 14 at least partly covers the first metal layer 12 and the second metal layer 16.

The insulated substrate 18 is configured to support all the elements located thereon. The insulated substrate 18 can be a flexible polymer material, such as silicone rubber, polystyrene, polypropylene, or polyethylene terephthalate. In one embodiment, the insulated substrate 18 is made of silicone rubber. A number of the SBDs can be arranged in accordance with a predetermined pattern and share a same insulated substrate, to form an SBD panel or other SBD semiconductor device.

Other characteristics of the SBD 20 are the same as those of SBD 10 discussed above.

Figure 6:
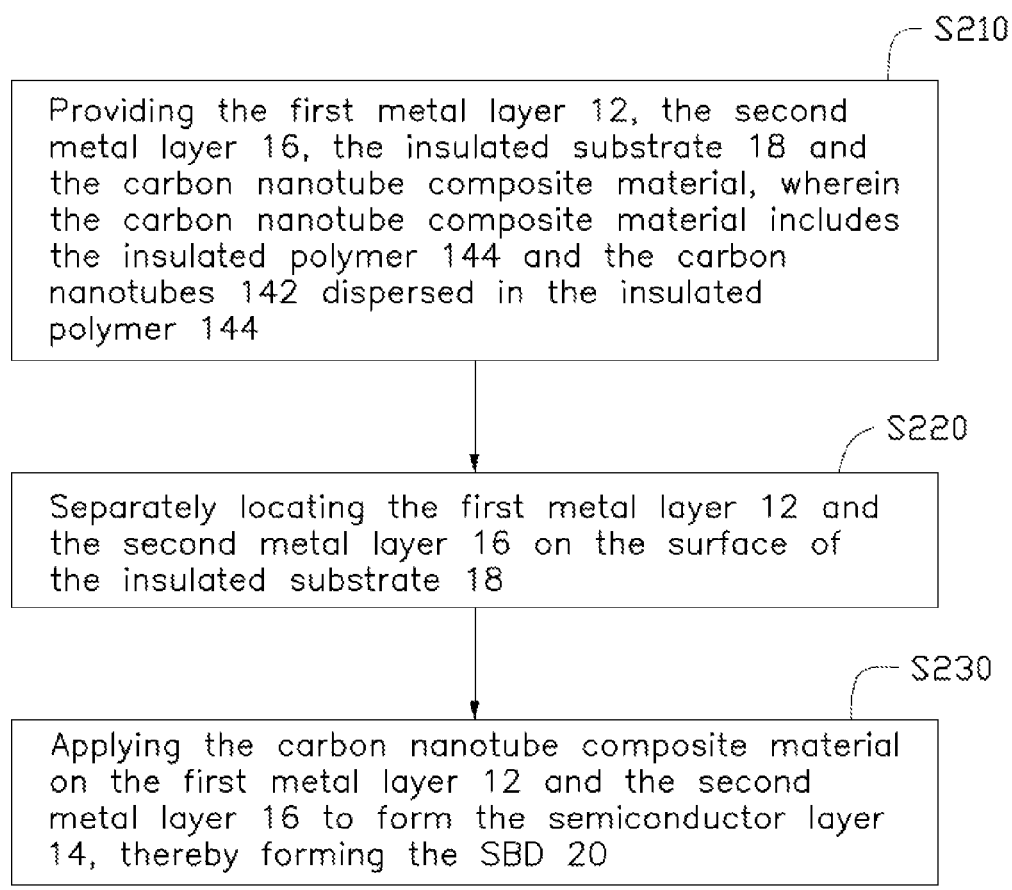
FIG. 6 is a making process flowchart of the SBD shown in FIG. 5.

Referring to FIG. 6, a method for making the SBD 20 includes the steps of:

S210, providing the first metal layer 12, the second metal layer 16, the insulated substrate 18 and a carbon nanotube composite material, wherein the carbon nanotube composite material includes the insulated polymer 144 and the carbon nanotubes 142 dispersed in the insulated polymer 144;

S220, separately locating the first metal layer 12 and the second metal layer 16 on the surface of the insulated substrate 18; and S230, applying the carbon nanotube composite material on the first metal layer 12 and the second metal layer 16 to form the semiconductor layer 14, thereby forming the SBD 20.

The step S210 for making the SBD 20 is similar to the step S10 for making the SBD 10 discussed above, except the step S210 further providing the insulated substrate 18.

The step S220 can be executed by adhering metal sheets to the surface of the insulated substrate 18 by an adhesive to form the first metal layer 12 and the second metal layer 16. It can be understood that the first metal layer 12 and the second metal layer 16 can be formed on the insulated substrate 18 by a depositing method. The depositing method can be magnetron sputtering, pulsed laser deposition, spraying, vacuum evaporation, or electrochemical plating.

The step S230 specifically includes forming the semiconductor layer 14 on the surface of the insulated substrate 18 between the first metal layer 12 and the second metal layer 16, by using the carbon nanotube composite material.

The step S230 can be executed by the same method mentioned in the step S21. That is, the carbon nanotube composite material is dropped on the surface of the insulated substrate 18 between the first metal layer 12 and the second metal layer 16; putting the insulated substrate 18 with the carbon nanotube composite material thereon into vacuum; and then deaerating in the carbon nanotube composite material.

The step S230 can also include the steps of: covering a region of non-forming the semiconductor layer 14 on the insulated substrate 18, the first metal layer 12 and the second metal layer 16 by a mask; depositing the carbon nanotube composite material on a region without the mask; and curing the carbon nanotube composite material; and removing the mask.

According to the above descriptions, the SBDs and the method for making the SBDs can have the following advantages. Firstly, the SBDs have good rectifying property. Secondly, the semiconductor layers have a relatively high mobility, such as 1.98 cm$^2$/(V·s). Thirdly, the semiconductor layers include the carbon nanotubes and the insulated polymer, the origin materials are easy to obtain and have low cost, and the semiconductor layers are flexible, which makes the SBDs be widely used in flexible electronic devices. In addition, the methods for making the SBDs are easy. The first and second metal layers of the SBDs are formed by directly using the metal sheets on the semiconductor layers or the insulated substrates, rather than evaporating metals on the semiconductor layers or the insulated substrates, which make the costs low.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A method for making a Schottky barrier diode, comprising:

providing a first metal layer, a second metal layer and a carbon nanotube composite material, wherein the carbon nanotube composite material comprises an insulated polymer and a plurality of carbon nanotubes dispersed in the insulated polymer; and applying the carbon nanotube composite material on the first metal layer and the second metal layer to form a semiconductor layer, wherein the semiconductor layer is in Schottky contact with the first metal layer and in ohmic contact with the second metal layer, wherein the carbon nanotube composite material is a liquid carbon nanotube composite material, applying the carbon nanotube composite material on the first metal layer comprises sub-steps of:

dropping the liquid carbon nanotube composite material on a surface of the first metal layer; and putting the first metal layer with the liquid carbon nanotube composite material thereon into a vacuum environment, wherein locating the second metal layer on a surface of the carbon nanotube composite material opposite to the first metal layer comprises sub-steps of:

curing the liquid carbon nanotube composite on the first metal layer to be a quasi-solid carbon nanotube composite material;

applying the second metal layer on the quasi-solid carbon nanotube composite material; and curing the quasi-solid carbon nanotube composite until the quasi-solid carbon nanotube composite is completely cured, thereby forming the semiconductor layer.

2. The method of claim 1, wherein providing the carbon nanotube composite material comprises sub-steps of:

dissolving a monomer into an organic solution to form a polymer solution; dispersing the plurality of carbon nanotubes into the polymer solution to obtain a first mixture;

removing the organic solution in the first mixture to get a second mixture; and adding a cross-linking agent into the second mixture to form the carbon nanotube composite material.

3. The method of claim 2, wherein the monomer comprises a first material that is selected from the group consisting of dimethyl siloxane, and methyl vinyl siloxane; and the organic solution comprises a second material that is selected from the group consisting of ethyl acetate, and ethyl ether.

4. The method of claim 1, wherein the step of forming the semiconductor layer comprises sub-steps of:
providing the first metal layer and the second metal layer;
applying the carbon nanotube composite material on the first metal layer; and
locating the second metal layer on a surface of the carbon nanotube composite material opposite to the first metal layer.

5. The method of claim 4, wherein the first metal layer has a sheet shape structure, the second metal layer has a sheet shape structure, and the carbon nanotube composite material is located between the first metal layer and the second metal layer.

6. The method of claim 5, wherein the carbon nanotube composite material is pretreated into a determined shape, applying the carbon nanotube composite material on the first metal layer comprises a sub-step of: adhering the carbon nanotube composite material to a surface of the first metal layer by an adhesive to form the semiconductor layer.

7. The method of claim 1, before applying the carbon nanotube composite material on the first metal layer and the second metal layer to form the semiconductor layer, further comprising steps of:
providing an insulated substrate with a surface; and
locating the first metal layer and the second metal layer on the surface of the insulated substrate, wherein the first metal layer is separate from the second metal layer.

8. The method of claim 7, wherein providing the first metal layer and the second metal layer comprises a step of providing two metal sheets.

9. The method of claim 8, wherein locating the first metal layer and the second metal layer on the surface of the insulated substrate comprises a step of adhering metal sheets to the surface of the insulated substrate by an adhesive to form the first metal layer and the second metal layer.

10. The method of claim 7, wherein forming the semiconductor layer comprises a step of forming the carbon nanotube composite material on the surface of the insulated substrate, and the carbon nanotube composite material is located between the first metal layer and the second metal layer to form the semiconductor layer.

11. The method of claim 10, wherein the step of forming the carbon nanotube composite material on the surface of the insulated substrate comprises sub-steps of:
covering a region of non-forming the semiconductor layer on the insulated substrate, the first metal layer and the second metal layer by a mask;
depositing the carbon nanotube composite material on a region without the mask;
curing the carbon nanotube composite material; and
removing the mask.

12. The method of claim 1, further comprising a step of encapsulating the Schottky barrier diode.

13. The method of claim 12, wherein the step of packaging the Schottky barrier diode comprises: forming a liquid resin to wrap the Schottky barrier diode; and curing the liquid resin to package the Schottky barrier diode.

14. The method of claim 1, wherein the insulated polymer comprises a material that is selected from the group consisting of silicon gel, silicone rubber, hypoxia resin, epoxy resin, acrylic resin, and polyester.

15. The method of claim 1, wherein a weight percentage of the plurality of carbon nanotubes in the semiconductor layer is in a range from about 0.1% to about 1%.

16. The method of claim 1, wherein the first metal layer comprises a first material that is selected from the group consisting of copper, aluminum and silver; and the second metal layer comprises a second material that selected from the group consisting of is gold, palladium and platinum.

* * * * *